United States Patent [19]

Haddon et al.

[11] Patent Number: 4,697,137
[45] Date of Patent: Sep. 29, 1987

[54] METHOD OF NONDESTRUCTIVELY ESTABLISHING AN EARTH GRADIENT FOR CABLE FAULT LOCATING

[75] Inventors: Merrill Haddon, Tigard; Clifford H. Moulton, Portland, both of Oreg.

[73] Assignee: Acqua-Tronics, Inc., Milwaukie, Oreg.

[21] Appl. No.: 822,126

[22] Filed: Jan. 24, 1986

[51] Int. Cl.$^4$ .......................................... G01R 31/10
[52] U.S. Cl. .................................................. 324/512
[58] Field of Search .................................. 324/52, 54

[56] References Cited

U.S. PATENT DOCUMENTS

| | | | |
|---|---|---|---|
| 1,212,467 | 1/1917 | Evershed | 324/54 |
| 2,176,757 | 10/1939 | Borden | 324/52 |
| 2,837,714 | 6/1958 | Hill | 324/54 |
| 3,199,023 | 8/1965 | Bhimani | 324/54 |
| 3,792,350 | 2/1974 | Bossler et al. | 324/52 |
| 3,991,363 | 11/1976 | Lathrop | 324/52 |
| 4,117,397 | 9/1978 | Fukao et al. | 324/54 |

Primary Examiner—Gerard R. Strecker
Attorney, Agent, or Firm—Chernoff, Vilhauer, McClung & Stenzel

[57] ABSTRACT

A fault is located in an insulated electrical conductor buried in earth by establishing a voltage gradient through the earth emanating from the fault, and thereafter sensing the direction of the gradient to locate the fault. The voltage gradient is established by applying a pulsed voltage initially to the conductor at a voltage level significantly less than the maximum voltage level of which the voltage source is capable. The presence or absence of a voltage gradient as a result of such initial voltage level is sensed and, if no gradient has been established, the voltage level is increased somewhat and reapplied, but at a level still significantly less than the maximum level of which the voltage source is capable. After the voltage gradient has been established, the voltage level varies within a range no higher than the initial voltage level at which the gradient was established, so as to maintain the voltage gradient.

6 Claims, 2 Drawing Figures

METHOD OF NONDESTRUCTIVELY ESTABLISHING AN EARTH GRADIENT FOR CABLE FAULT LOCATING

BACKGROUND OF THE INVENTION

The present invention is directed to improvements in methods for locating faults in underground, unshielded, insulated electrical cables by establishing a voltage gradient through the earth emanating from the fault, and sensing the direction of the gradient to locate the fault.

Insulated electrical cables buried in the earth often develop faults due to insulation failure. If the faulted cable has an aluminum conductor, the fault area tends to develop a high-impedance aluminum hydroxide coating due to exposure to moisture in the ground; alternatively, if the faulted cable has a copper conductor, a high-impedance copper sulfate coating often develops at the fault.

A common method of locating the fault has been the so-called earth gradient method. The faulted cable is isolated at both ends and then a pulsed voltage is applied between one end of the faulted cable and a ground rod. When the pulsed voltage overcomes the impedance of the fault (i.e. "flashes" the fault), fault current travels from the fault to the ground rod. The fault current sets up a voltage gradient field in the earth whose direction can be detected, usually by a high-gain amplifier feeding a "zero" center meter. The inputs to the detector are two probes that can be pushed into the ground to sense the voltage gradient present. The detector is moved down the route of the faulted cable and, at regular intervals, the input probes are imbedded in the ground at positions spaced from each other. The input probe that is closest to the fault will deflect the meter toward that probe. If the detector passes beyond the fault, the meter deflects in the opposite direction, because the opposite input probe is now closer to the fault. When the two probes are at an equal distance on each side of the fault, the meter will not deflect.

Because of the expected high impedance at the fault location, the conventional practice has been to apply the pulsed voltage initially to the faulted cable at a high level at or near the maximum voltage of which the voltage source is capable, for example at several thousand volts. After the gradient has been established (i.e. after the fault has been flashed), the impedance decreases and the voltage automatically reduces as current increases, due to the output power limitations of the voltage source. A current meter connected to the ground rod is normally used to detect the establishment of the voltage gradient. If the fault impedance should increase for any reason after initial establishment of the voltage gradient, the output voltage is likewise permitted to rise accordingly, even to the maximum voltage limit of the source if necessary.

The principal problem with the foregoing conventional practice is that the cable is often overstressed by being subjected to a voltage much higher than that for which it was designed, and much higher than is needed to flash the fault. The initial application of an excessively high voltage, even if only for a few pulses, can severely damage a cable. If such a high voltage is permitted to be reapplied after initial establishment of an earth gradient field, the risk of damage increases.

SUMMARY OF THE PRESENT INVENTION

The present invention is a method for cable fault locating which minimizes the foregoing risk by applying the voltage initially to the faulted cable at a level significantly less than the maximum voltage level of which the voltage source is capable, for example, at merely a few hundred volts. The operator then senses whether or not the initial low voltage level is sufficient to establish the voltage gradient. If the voltage gradient is established at such low level, the voltage thereafter varies within a range no higher than the initial voltage level so as to maintain the voltage gradient. If the voltage gradient is not initially established, the voltage level is increased slightly, but still to a level significantly less than the maximum voltage level of which the voltage source is capable, and the presence or absence of the gradient is again sensed. When the voltage gradient is finally established as a result of this gradual incrementing of input voltage, the voltage level thereafter varies within a range no higher than the level which was finally sufficient to establish the gradient. As a result of the foregoing method, the necessary field gradient for fault location can be established and maintained without risking overstressing of the cable with excessively high voltage.

The foregoing and other objectives, features, and advantages of the invention will be more readily understood upon consideration of the following detailed description of the invention, taken in conjunction with the accompanying drawings.

DESCRIPTION OF THE PREFERRED EMBODIMENT

Figure 1:
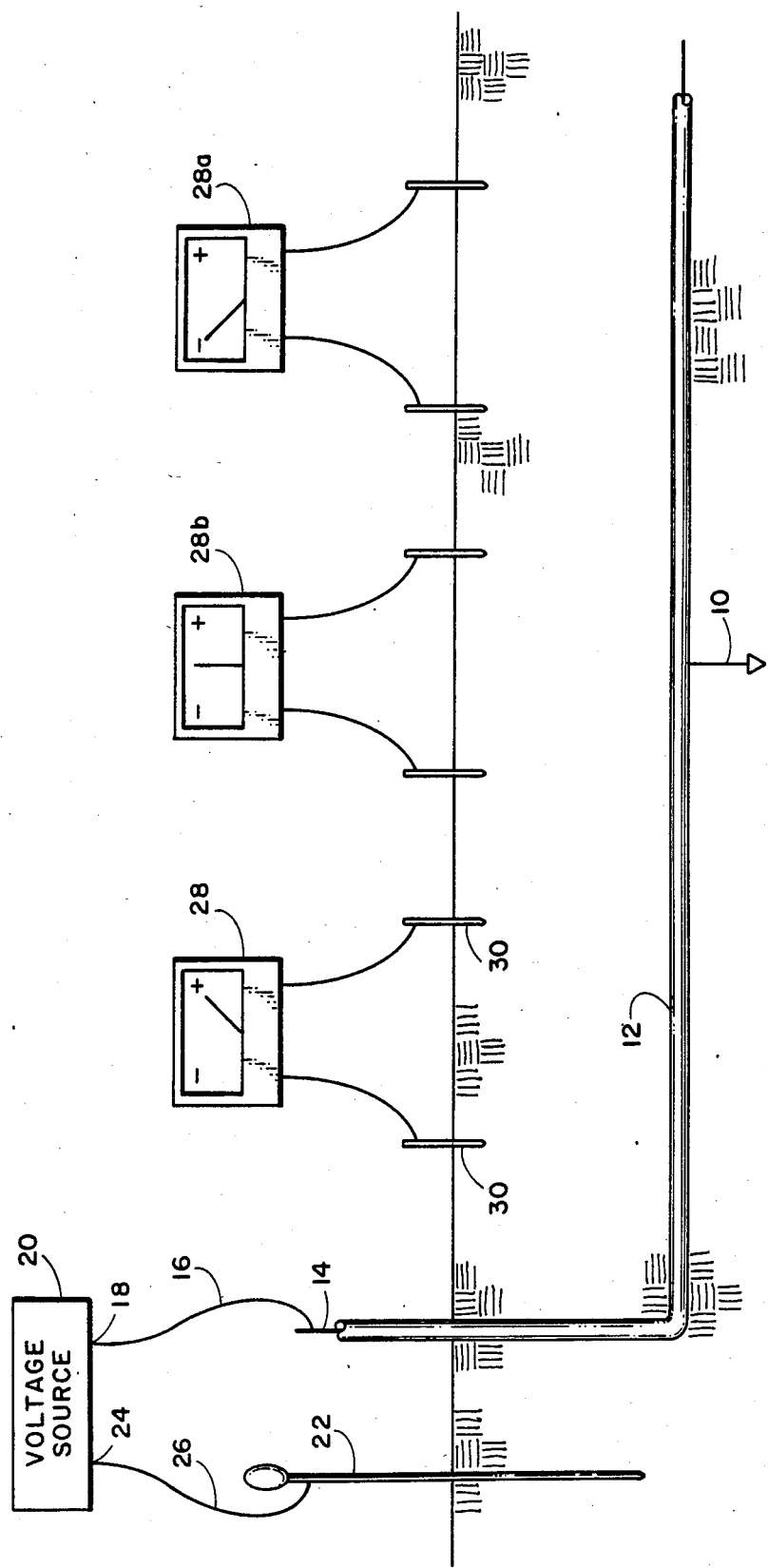
FIG. 1 is a schematic diagram showing the connection of a voltage source to a faulted underground cable and the use of a detector to locate the fault.

FIG. 1 depicts generally the overall methodology for locating a fault 10 in an underground cable 12. The cable 12 is isolated at both ends and one end 14 is then connected through a lead 16 to the output terminal 18 of a voltage source 20. A ground rod 22 is implanted in the earth along the route of the cable in the general vicinity of the fault and connected to the ground terminal 24 of the voltage source by a lead 26. In a manner to be described more fully hereafter, the voltage source 20 applies a pulsed voltage to the cable 12, thereby establishing a voltage gradient through the earth from the fault 10 to the ground rod 22. A detector 28 having a pair of input probes 30 is then moved gradually down the route of the faulted cable, the probes 30 being embedded in the earth at progressive locations along the route of the cable, as exemplified by the three locations shown in FIG. 1. At each location, the probes 30 are spaced apart in the direction of the cable. The input probe that is closest to the fault will deflect the "zero" reading meter toward that probe. As the detector passes beyond the fault, the meter will deflect in the opposite direction, as exemplified by the detector 28a. When the two probes are at an equal distance on each side of the fault, the meter will remain at "zero," as exemplified by the detector 28b, thereby indicating the location of the fault 10.

According to the method of the present invention, the voltage from the voltage source 20 is initially applied to the cable 12 at a voltage level significantly less than the maximum voltage level of which the voltage source 20 is capable. Preferably, such initial voltage level is the lowest level of which the voltage source is capable (for example, 300 volts), so that if the fault is not of a high impedance the low voltage level will be sufficient to establish the voltage gradient. If a voltage gradient is established by the application of the initial voltage level, the voltage level thereafter varies regulated within a range no higher than the initial voltage level to maintain the voltage gradient. If, on the other hand, no voltage gradient is established by the initial voltage level, the voltage level is increased somewhat, but still significantly less than the maximum voltage level of which the voltage source 20 is capable, and the process is repeated. If no voltage gradient is established, further progressive increases in voltage level are effected until the voltage gradient is established, after which the voltage level varies within a range no higher than that at which the voltage gradient was finally established, so as to maintain the voltage gradient.

Figure 2:
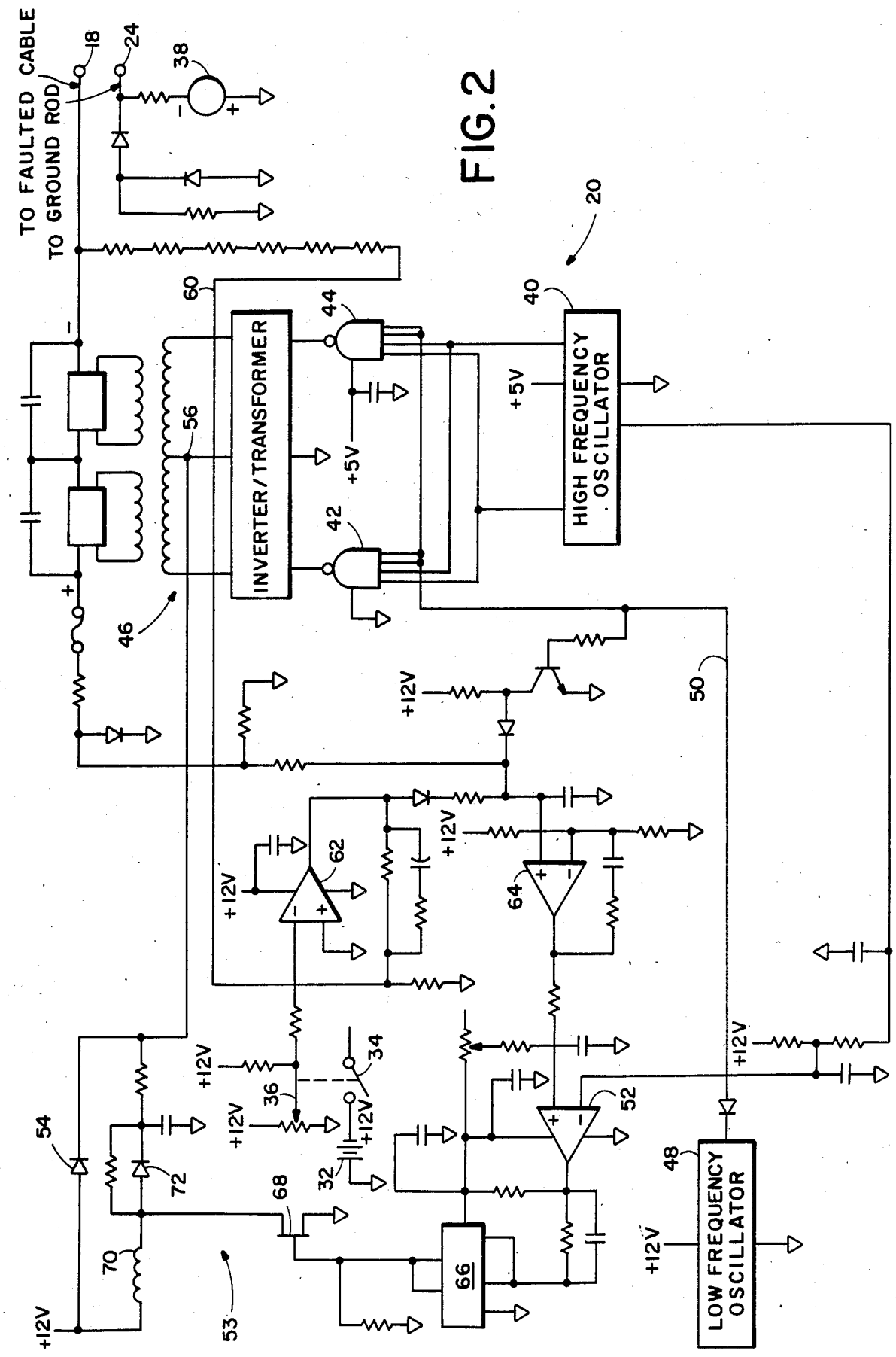
FIG. 2 is a simplified circuit diagram of an exemplary voltage source suitable for use in practicing the method of the present invention.

To aid in the understanding of how the foregoing method is carried out, the operation of the exemplary voltage source 20 will be explained in conjunction with the simplified circuit diagram of FIG. 2. The voltage source 20 produces a minus pulsating voltage at terminal 18, selectively variable in a range from 300 volts to 3000 volts. The circuit is powered by any suitable 12-volt DC source such as a rechargeable battery 32, or a transformed and rectified 120-volt AC source. Power to the unit is controlled by a manual on/off switch 34 connected to an output voltage level controller 36 such that, for the switch 34 to be off, the voltage controller 36 must be at its lowest output voltage setting, i.e. at 300 volts. The voltage controller 36 is capable of setting the output voltage level at any predetermined level within the above-mentioned range of 300 volts to 3000 volts.

An output meter 38, connected to the ground terminal 24 of the voltage source 20, begins pulsing when the fault flashes, thereby indicating the establishment of the voltage gradient. Until the meter 38 pulses while the voltage source is outputting, the operator should not attempt to locate the fault with the detector 28, because no earth gradient field will yet be present.

A high-frequency oscillator 40 provides a signal to a pair of gates 42, 44 which, in turn, drive an inverter/transformer circuit indicated generally as 46. The circuit 46 is driven, however, only when a low-frequency oscillator 48 provides a suitable pulse through line 50 to the gates 42 and 44. The oscillator 48 produces the necessary pulse for a duration of onehalf second every four seconds, thereby establishing the output pulse rate and duration at terminal 18.

When the voltage controller 36 is at its minimum setting, power is delivered through diode 54 directly from the 12-volt power source to the center tap 56 of the circuit 46. The transformer has a 25:1 step-up ratio, so that the 12 volts provides a minus 300-volt output pulse at terminal 18. Feedback of a sample of the minus output pulse is provided through line 60 to the inverting input of an operational amplifier 62, where it is summed with the positive input from voltage controller 36 (which is low at its minimum setting) to produce a high positive output voltage from amplifier 62. This positive output voltage is fed through an integrator 64 to the noninverting input of a voltage comparator 52. Simultaneously, the inverting input of comparator 52 is receiving a positive ramp pulse from oscillator 40. Because of the high positive magnitude of the output of integrator 64 (above the maximum ramp pulse voltage at the inverting input) the comparator 52 produces no output pulse necessary to drive a voltage boost circuit indicated generally as 53.

Thus, when the operator first moves the switch 34 to the "on" position (without increasing the setting of the voltage controller 36) only the initial minimum voltage level of 300 volts at output terminal 18 is available for the initial attempt to establish a voltage gradient. If the voltage gradient is established (indicating that the fault impedance is low), the output voltage will reduce to below the initial 300-volt level because of the power limitations of the voltage source 20, i.e. the circuit 46 cannot supply enough current to a low-impedance fault to maintain a 300-volt output. If the fault impedance should increase after the voltage gradient is established, the output voltage level will rise accordingly. However, because the operator has not increased the setting of the voltage controller 36 above its minimum setting, the output voltage will not increase beyond the initial 300 volts regardless of how much the fault impedance might increase.

If the initial voltage level of 300 volts proves insufficient to establish the needed voltage gradient, as indicated by the failure of meter 38 to pulse, the operator increases the setting of voltage controller 36 somewhat, but still to a voltage level much lower than the maximum of which the voltage source 20 is capable. As the setting of voltage controller 36 is increased, its positive input to operational amplifier 62 likewise increases causing the output of the amplifier to become less positive. The resultant integrated signal at the noninverting input of voltage comparator 52 therefore becomes less positive than the maximum voltage of the ramp pulse at the inverting input. Comparator 52 accordingly begins to produce an output pulse whose width increases as the level of the positive signal at the noninverting input decreases. The output pulse from comparator 52 is fed to a two-phase MOS oscillator 66 whose output enables oscillating current to pass through FET 68, driving inductor 70. Inductor 70 provides a boosted voltage, through diode 72, to the center tap 56 of circuit 46, thereby raising the output voltage at terminal 18. In this manner voltage controller 36 can, if the operator desires, selectively adjust the maximum output voltage by means of the voltage boost circuit 53 to any predetermined maximum voltage level up to 3000 volts (where the inductor 70 is producing a maximum boosted voltage of 120 volts.) The selected maximum voltage level is controlled by means of the continuous feedback of the negative output voltage sample through line 60, and its summing with the voltage controller signal at the inverting input of amplifier 62.

Accordingly, the operator, when he is unable to establish the needed voltage gradient at one preselected maximum voltage level, merely increases the maximum output voltage progressively by means of voltage controller 36 until the voltage gradient is established. The eventual establishment of the gradient will normally lower the impedance of the fault, and the output voltage will automatically reduce to the value permitted by the maximum power limit of the voltage source, as explained previously. Should the fault impedance increase again, the output voltage will likewise increase accordingly but, because of the setting of the voltage controller 36 which has been left by the operator at the voltage level which established the voltage gradient, the output voltage cannot increase beyond such setting.

When fault location has been completed, the voltage source 20 is no longer needed and it may be deactivated by means of on/off switch 34. To ensure that the next use of the voltage source 20 will begin with an application of a minimum voltage level to a fault, the mechanical interconnection between the on/off switch 34 and the voltage controller 36 requires that the voltage controller setting be reduced to its minimum voltage setting whenever the voltage source 20 is deactivated.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of locating a fault in an insulated electrical conductor buried in earth by establishing a voltage graident through said earth emanating from said fault and thereafter sensing the direction of said gradient to locate said fault, such method including establishing said gradient by electrically isolated said conductor at respective ends located on each side of said fault, embedding a ground rod in said earth, electrically connecting a voltage source, having a maximum voltage level capable of establishing a voltage graident from said fualt to said ground rod despite any existence of an aluminum hydroxide or copper oxide coating on said conductor at said fault, between one of said ends of said conductor and said ground rod, and applying a voltage from said voltage source to said conductor, wherein the improvement comprises applying said voltage initially to said conductor at an initial voltage level significantly less than the maximum voltage level which said voltage source is capable of applying to said conductor, sensing whether or not said initial voltage level is sufficient to establish said voltage gradient by observing a meter responsive to the flow of electrical current from said voltage source to said ground rod and, after sensing the establishment of said voltage gradient, sensing the direction of said gradient to locate said fualt.

2. The method of claim 1, futher inlcuding reducing the voltage level, applied by said voltage source to said conductor, from said initial voltage level in response to the establishment of said voltage gradient, and thereafter varying said voltage level within a range no higher than said initial voltage level.

3. The method of claim 1, further including increasing the voltage level, applied by said voltage source to said conductor, to an increased voltage level higher than said initial voltage level but less than said maximum voltage level, in response to the failure of said initial voltage level to establish said voltage gradient.

4. The method of claim 3, further including reducing the voltage level, applied by said voltage source to said conductor, from said increased voltage level in response to the establishment of said voltage gradient, and thereafter varying said voltage level within a range no higher than said increased voltage level.

5. The method of claim 1, further including predetermining said initial voltage level.

6. The method of claim 1 wherein said voltage source includes a switch for selectively activating or deactivating said voltage source, and a control for adjustably setting the voltage level to be applied by said voltage source to a conductor, further including reducing the voltage level setting of said control in response to the deactivation of said voltage source by said switch.

* * * * *